United States Patent [19]

Maeda et al.

[11] Patent Number: 4,519,764
[45] Date of Patent: May 28, 1985

[54] APPARATUS FOR FABRICATING POLYCRYSTALLINE SILICON WAFER

[75] Inventors: Yasuhiro Maeda; Takashi Yokoyama; Shinichi Yagihashi, all of Sapporo, Japan

[73] Assignee: Hoxan Corporation, Sapporo, Japan

[21] Appl. No.: 644,548

[22] Filed: Aug. 27, 1984

Related U.S. Application Data

[62] Division of Ser. No. 373,039, Apr. 29, 1982.

[30] Foreign Application Priority Data

Apr. 30, 1981 [JP] Japan ................................ 56-66021

[51] Int. Cl.³ .............................................. B29C 5/04
[52] U.S. Cl. ..................................... 425/256; 425/425; 425/435; 425/447
[58] Field of Search ................ 425/256, 425, 435, 447

[56] References Cited

U.S. PATENT DOCUMENTS

| 2,618,031 | 11/1952 | Mazer | 425/256 X |
| 3,030,668 | 4/1962 | Taylor | 425/425 X |
| 3,290,423 | 12/1966 | Hatch et al. | 425/425 X |
| 4,026,335 | 5/1977 | Willemsen | 425/425 X |
| 4,214,863 | 7/1980 | Nixon | 425/256 X |
| 4,479,769 | 10/1984 | Simioni | 425/425 X |

Primary Examiner—J. Howard Flint, Jr.
Attorney, Agent, or Firm—George B. Oujevolk

[57] ABSTRACT

A method of fabricating a polycrystalline silicon wafer, which method advantageously has the steps of radially outwardly flowing molten liquid of silicon base material on the wafer forming surface of a turntable mechanism by means of centrifugal force, thereby forming a thin molten liquid layer in a prescribed atmosphere, and cooling and solidifying the same. An apparatus for fabricating the wafer is used to carry out the method with a recover tray arranged at the wafer forming surface for receiving the excessive silicon liquid scattered, and a wafer tray placed on the recovery tray, and the wafer forming surface is cooled with coolant flowing in the wafer forming mechanism. Thus, large crystalline grains can be grown on the wafer in free states with the atmosphere from the inner surfaces of the casting mold as the conventional method.

2 Claims, 23 Drawing Figures

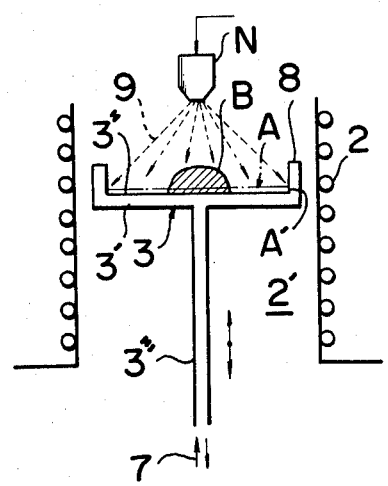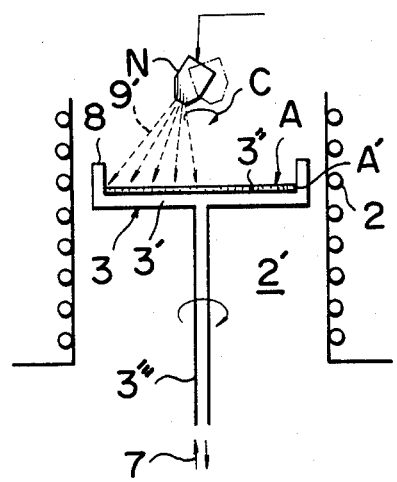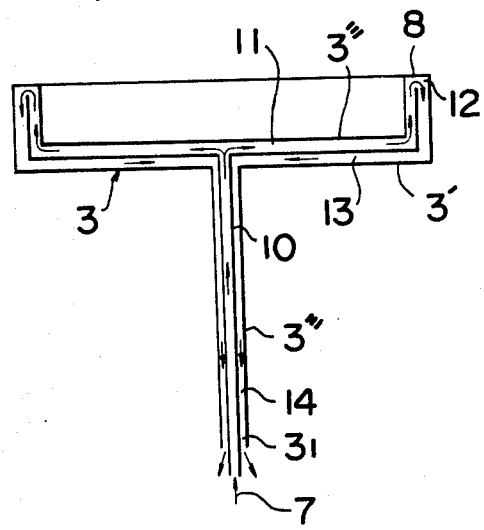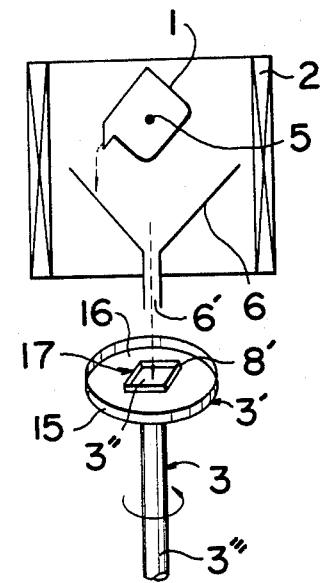

APPARATUS FOR FABRICATING POLYCRYSTALLINE SILICON WAFER

This application is a divisional application of U.S. patent application Ser. No. 06/373,039 filed April 29, 1982.

BACKGROUND OF THE INVENTION

This invention relates to a method of fabricating a polycrystalline silicon wafer used for a solar battery, a photoelectric converter, etc.

A polycrystalline silicon wafer is heretofore fabricated by a variety of methods. Generally, an ingot of prescribed shape is temporarily cast from a silicon base material, and is then sliced to fabricate a wafer. Since this conventional method takes a long time to slice the ingot and yet approx. 50% of the ingot is wasted at the time of slicing the ingot, the product of the wafer becomes expensive, and it is further impossible to fabricate a number of wafers in a mass production.

A ribbon method and a casting method are already executed as a method without slicing step for that purpose. The ribbon method has, for example, the steps of injecting molten silicon to the peripheral surface of a rotating drum and forming a ribbon-shaped wafer on the peripheral surface of the drum. According to this ribbon method, the ribbon having a width of several millimeters can only be fabricated, and it has such difficulty that a solar battery cell of large size cannot be fabricated.

The casting method has the steps of heating a silicon base material into its molten liquid, pouring the molten silicon material in a mold prepared in response to the size of the wafer of the product, and further press molding the molten material by the movable mold to solidify the molten material. According to this casting method, the wafer of prescribed shape can be obtained simultaneously and a preferred result can be expected at the viewpoint of its mass production, but the molten silicon base material is urged from all the peripheral directions.

Thus, the grown of silicon crystalline grains is disadvantageously suppressed according to this casting method when the molten silicon material is solidified among the upper, lower and side surfaces of the casting mold. This causes the vicinity of the parts of the silicon material to be solidified in contact with the upper, lower and side surfaces of the mold to become extremely fine crystalline grains, but cannot obtain large crystalline grains. This does not satisfy the requirements of the production of large crystalline grains which are desired for a silicon wafer used for a solar battery cell. Accordingly, the photoelectric conversion efficiency of the solar battery thus obtained with the wafer is remarkably deteriorated to 2 to 3% as its drawbacks and disadvantages.

SUMMARY OF THE INVENTION

Accordingly, a primary object of this invention is to provide a method of fabricating a polycrystalline silicon wafer which can form large crystalline grains in the polycrystalline wafer of desired size in mass production without loss of the silicon base material with a simple facility by radially flowing the molten liquid of the silicon base material on the wafer forming surface of a turntable mechanism by means of the centrifugal force produced by the rotating of the mechanism and thus forming a thin molten liquid layer of desired size with the molten liquid as well as cooling and solidifying the liquid.

Another object of this invention is to provide a method of fabricating a polycrystalline silicon wafer which can simply obtain the polycrystalline silicon wafers of a variety of desired shapes in addition to the above primary object by forming a molten liquid thin layer of silicon base material in a desired shape defined at the rising peripheral edge stood at the outer periphery of the wafer forming surface of a turntable mechanism, cooling the layer and solidifying the layer when forming the layer with the molten liquid by radially flowing the molten liquid on the wafer forming surface by means of the centrifugal force produced by the rotating of the mechanism.

Yet another object of this invention is to provide a method of fabricating a polycrystalline silicon wafer which can suppress the mixture of an impurity in the wafer of the product and can also improve the productivity by not only radially flowing the silicon base material by means of the centrifugal force but also radially flowing the silicon material by means of gas injection from a nozzle, thereby shortening the time required to convert molten liquid state of the silicon base material to solidified, state.

A further object of this invention is to provide a method of fabricating a polycrystalline silicon wafer which can readily obtain a wafer product of desired shape, e.g., a square shape and of desired thickness by externally exhausting and hence overflowing the molten liquid of silicon base material excessively supplied of the liquid from the rising peripheral edge stood at the outer periphery of the wafer forming surface when radially flowing the liquid by the centrifugal force as described above, cooling and solidifying the thin molten liquid layer thus obtained, then filling the space defined by the wafer forming surface and the rising peripheral edge with the supplied molten liquid to form the thin molten liquid layer as well as can eliminate the drawbacks of decreasing the rate of solar battery in the prescribed area when the battery is of circular disc and hence the module charging density when forming the module with the solar battery produced with the wafer product and can improve the charging density with the solar battery of desired square shape.

Still another object of this invention is to provide a method of fabricating a polycrystalline silicon wafer which can decrease the restriction of the crystalline grains of the wafer so as to obtain the wafer product having further larger crystalline grains in a desired size in addition to the further object by forming the thin molten liquid layer over the entire surface of the wafer forming surface with the supplied molten liquid by externally exhausting the molten liquid thus excessively supplied from the outer peripheral edge of the wafer forming surface formed as the continuous surface on the outside surface when externally exhausting the excessive molten liquid toward the outer periphery of the wafer forming surface as described above, cooling and solidifying the liquid.

Still another object of this invention is to provide a method of fabricating a polycrystalline silicon wafer which can eliminate the defect of cutting off the depending edge from the outer peripheral edge of the wafer product by coating a moisture preventive agent of boron nitride or the like on the outside surface continued to the wafer forming surface as described above.

Still another object of this invention is to provide a method of fabricating a polycrystalline silicon wafer which can effectively eliminate the defect of cutting off the depending edge from the outer peripheral edge of the wafer product by exhausting the molten liquid of silicon base material excessively supplied from the wafer to the excessively supplied silicon exhausting surface formed by boron nitride on the outside of the wafer forming surface when obtaining the wafer product of desired shape by discharging the excessively supplied liquid by means of the centrifugal force from the wafer forming surface, and forming the thin molten liquid layer over the entire surface of the wafer forming surface with the supplied molten liquid as well as cooling and solidifying the liquid.

Still another object of this invention is to provide a method of fabricating a polycrystalline silicon wafer which can eliminate pinholes feasibly occurred in the wafer product and irregular thickness of the wafer due to the uneven surface thereof by forming the thin molten liquid layer on the wafer forming surface in the first step repeatedly, supplying the molten liquid of silicon base material onto the wafer when cooling and solidifying the molten liquid to obtain the substrate wafer, radially flowing the molten liquid by means of the centrifugal force produced by the rotation of the turntable mechanism, anc carrying out more than once the step of forming the increased thickness wafer by depositing and solidifying the molten liquid on the substrate wafer.

Still another object of this invention is to provide an apparatus for fabricating a polycrystalline silicon wafer by radially flowing the molten liquid of silicon base material on the wafer forming surface of a turntable mechanism in a desired atmosphere by means of the centrifugal force produced by the rotation of the mechanism to form the thin molten liquid layer of desired size with the molten liquid, cooling and solidifying the liquid, which apparatus can eliminate the defect of damaging various units installed in the vicinity of the outside due to the adhere of the scattered molten silicon liquid without uselessly wasting the silicon base material by arranging a recovery tray for receiving the excessive molten liquid scattered from the wafer forming surface at the outer peripheral side of the wafer forming surface.

Still another object of the invention is to provide an apparatus for fabricating a polycrystalline silicon wafer which can suitably rapidly cool and solidify the molten liquid layer on the wafer forming surface and can improve the productivity by constructing to make it possible to cool the wafer forming surface with coolant or refrigerant, e.g., inert gas or the like flowing in a member forming the wafer forming surface.

The above and other related objects and features of the invention will be apparent from a reading of the following description of the disclosure found in the accompanying drawings and the novelty thereof pointed out in the appended claims.

BRIEF DESCRIPTION OF THE DRAWINGS

FIGS. 3(a) and 3(b) are explanatory front views of the apparatus of the invention, wherein FIG. 3(a) shows the fabrication preparing state, and FIG. 3(b) shows the final fabrication state;

FIG. 4 is an explanatory front view of still another preferred embodiment of the apparatus according to the present invention;

FIG. 5 is an explanatory front view of modified example of the apparatus shown in FIG. 4;

FIG. 6 is an explanatory front longitudinally sectional view of the turntable mechanism used in the apparatus of the invention;

FIG. 7 is an explanatory front view of the still another preferred embodiment of the apparatus of the invention used for carrying out the method of fabricating the wafer;

DESCRIPTION OF THE PREFERRED EMBODIMENTS

Figure 1:
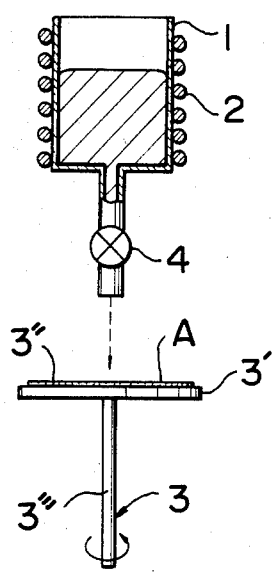
FIG. 1 is an explanatory front view of the apparatus for fabricating a polycrystalline silicon wafer used for executing the method of fabricating the same according to the present invention.

Reference is now made to the drawings, particularly to FIG. 1, which shows one preferred embodiment of the apparatus for fabricating a polycrystalline silicon wafer for executing the method of fabricating the wafer according to the present invention. In FIG. 1, a melting heat source 2, e.g., an electric heater or the like is arranged at the outer peripheral side of a crucible 1. A silicon base material thrown into the crucible 1 is heated by the heat source 2 by considering 1,420° C. of the melting point of the silicon, and is thus molten in the crucible 1. The heat source 2 may be, as shown in FIG. 1, an electric heating wire, a high frequency heater, which is preferred to be suitably stopped heating or controllable in the heating conditions.

The silicon base material may be metallic silicon, semiconductor high purity silicon, etc. The material of the crucible 1 may be quartz, graphite, etc. which is preferably less reactive with the silicon. In the apparatus exemplified in FIG. 1, a turntable mechanism 3 is arranged directly under the crucible 1. Since a turntable 3' of the mechanism 3 is spaced from the heat source 2 on the surface thereof, it is not thermally affected by the heat source. The turntable 3' may be formed of the material of the same type as the crucible 1 due to the same reason described above with respect to the crucible 1.

A cock 4 is provided at the bottom of the crucible 1. When the silicon base material in the crucible 1 is molten by the heat source 2 to become molten liquid, the molten liquid may be dropped substantially from the center of a wafer forming surface 3" of the upper surface of the turntable 3' by opening the cock 4.

The quantity of the molten liquid thus dropped may be adjusted by controlling the degree of opening the cock 4. When the molten liquid is dropped, it is preferred to rotate in advance the turntable 3'. However, the turntable 3' may be rotated simultaneously upon opening of the cock 4, or may start rotating before the molten liquid is not solidified after the liquid is completely dropped. The molten liquid is radially outwardly flowed by means of the centrifugal force of the rotating turntable 3', and a thin molten liquid layer A having a predetermined diameter may be formed.

In the case exemplified in FIG. 1, since the turntable 3' is not heated by the heat source 2, the thin liquid layer A may be solidified by natural cooling, and a polycrystalline silicon wafer of thin disc layer can be obtained.

The size of the wafer can be controlled by the rotating speed of the turntable 3'. The rotating speed may be empirically obtained by considering the relationship between the quantity of the molten liquid and the thickness of the wafer. The rotating speed of the turntable to obtain a desired ordinary wafer may be relatively slow speed, e.g., 100 to 1,000 rpm. The size of the turntable 3' should be larger than the diameter of the wafer to be obtained.

Figure 2:
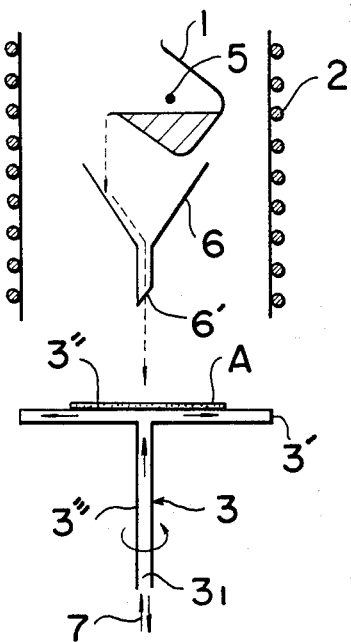
FIG. 2 is an explanatory front view of another preferred embodiment of the apparatus according to the present invention.

In the apparatus exemplified in FIG. 2, a cock is not provided at the crucible 1. The crucible 1 is rotated around the center of rotation 5 as an axis of rotation, and the molten liquid of silicon base material can be discharged from the opening of the crucible 1. A funnel 6 is arranged directly under the crucible 1, is formed of the same material as the crucible 1, and is arranged under the heating condition by the heat source 2. The turntable 3' arranged directly under the funnel is disposed relatively in the vicinity to be heated by the heat source 2.

The molten silicon liquid thus discharged from the crucible 1 due to the rotation of the crucible 1 is temporarily received by and is flowed down to the funnel 6, is further flowed down from the outlet 6' of the funnel 6 onto the upper surface of the turntable 3'. Thus, this molten liquid layer A can be obtained by the centrifugal force produced by the rotation of the turntable 3' in the same manner as the apparatus shown in FIG. 1.

In order to solidify the thin molten liquid layer A, it may be allowed to stand for by natural cooling as in the previous embodiment. When the layer A becomes to have desired diameter in this case, the heat source 2 is deenergized. However, the molten liquid remains heated in the crucible 1 while the heat source 2 is energized ON, and the turntable 3' may be forcibly cooled to solidify the layer A.

The forcibly cooling means used in this apparatus may be, as shown in FIG. 2, constructed that the turntable 3' is formed in cavity including the rotating shaft 3''' and water, inert gas, e.g., He, Ar, or the like is supplied as a coolant 7 from the opening end $3_1$ of the shaft 3''' formed in a pipe shape.

It is preferred to lower the cooling temperature decreased within approx. 200° C. from the melting point of the silicon. In this case, the cooling temperature may be maintained constantly, or may be melting temperature at the time of dropping the molten liquid of silicon and may be thereafter controlled to drop at a rate of approx. 10° C. per minute. In any of the cases shown in FIGS. 1 and 2, when the thin molten liquid layer A becomes to have a predetermined diameter, the rotation of the turntable mechanism 3 is stopped, or is not stopped, but the rotating speed of the mechanism 3 is decelerated to impart the condition that the diameter of the layer may be increase larger than that state. The rotation of the turntable may be maintained in this case if the diameter is not increased while suitably forcibly cooling the layer.

Figure 3A:
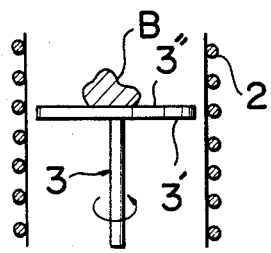
Figure 3B:
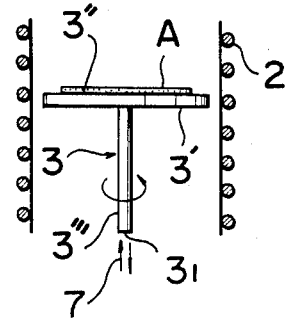

In the apparatus exemplified in FIGS. 3(a) and 3(b), a turntable 3' is merely disposed under the heating condition by ther heat source 2. Silicon base material B is placed in advance in the predetermined quantity, as shown in FIG. 3(a) substantially at the center on the wafer forming surface 3" of the turntable 3'.

In this embodiment, semiconductor high purity silicon is preferably used for the silicon base material B. When a wafer having an area of 45 cm$^2$ and a thickness of 0.5 mm is desirably obtained, the quantity of the material is approx. 5.0 g. When the heat source 2 is energized, the silicon base material B is molten. The turntable 3 may be rotated at a low speed of the degree that the silicon base material B may not drop from the turntable 3' in the step of melting the material B.

When the silicon base material B is thus molten, the turntable 3' not rotated so far is rotated at the predetermined rotating speed. When the turntable 3' is rotated so far, it may be accelerated in rotation as required. Thus, the molten liquid of the silicon base material is radially outwardly flowed by means of the centrifugal force in the same manner as the previous embodiment, and a thin molten liquid layer A can be thus obtained.

The thin molten liquid layer A may be solidified by natural cooling when the heat source 2 is deenergized or by forcibly cooling with the cooling means as described above with reference to FIG. 2.

Several embodiments of the apparatus for fabricating the polycrystalline silicon wafer according to the present invention have been described in detail. In these embodiments, these devices in the apparatus may be contained within a chamber (not shown), which may be evacuated in vacuum, or in which an inert gas, e.g., He, Ar, etc. may be introduced as an inert gas atmosphere as required. It can prevent the mixture of an impurity from the exterior or environment into the container under such conditions.

Experimental example of fabricating a polycrystalline silicon wafer will be described in detail. A silicon base material which contained $10^{15}$/cm$^3$ of impurity (boron) was thrown into a crucible made of quartz and graphite, and was heated and molten at approx. 1,450° C. in an argon atmosphere. The molten liquid of the silicon base material thus heated was then dropped in several droplets to the center on the turntable through a funnel of quartz and graphite. Simultaneously, a turntable mechanism was rotated, and when a thin molten liquid layer having approx. 5 cm of diameter and approx. 0.5 mm of thickness was formed in this manner, the turntable was stopped rotating and heating. The turntable was heated by He gas to thus solidify the thin molten liquid layer.

The polycrystalline silicon wafer (P-type, resistivity: 1 to 8 Ωcm) thus obtained was chemically etched by an ordinary method, was mirror-polished on the surface, and was used to fabricate a solar battery as below.

Phosphorus (P) was diffused in the wafer thus fabricated with $PH_3$ (phosphine) in $N_2$ atmosphere at 850° C. by an ordinary method, and an n-type layer of 0.3 μm was formed on the surface. Then, front and back surface electrodes of TiAg are mounted respectively on the front and back surfaces of the wafer, and a reflection preventive film is covered thereon to thus obtain a final product of wafer.

A light of 100 w/cm$^3$ of AMI was irradiated via a solar simulator to a solar battery thus fabricated with the wafer, and then the photoelectric conversion efficiency of 4 to 6% was obtained.

Since the method of fabricating the polycrystalline silicon wafer according to the present invention can eliminate the difficulty of the conventional slice method and ribbon method of an ingot, is not limited by the respective surfaces of the casting mold as in the conventional casting method but can solidify the silicon base material placed on the turntable, the molten silicon liquid can be contacted only with the wafer forming surface 3" merely at the lower surface thereof. Accordingly, the molten liquid can be solidified in free state with respect to the lateral and longitudinal axial directions, and can thus grow in the crystalline grains almost without suppressing factor, with the result that large crystalline grains can be uniformly grown in the interior and at the circumferential part. Since the molten liquid is contacted only with one side surface, it is not apprehended to be cracked at the wafer due to the difference of the thermal expansion at the time of solidifying the wafer.

The apparatus for fabricating the polycrystalline silicon wafer for executing the method according to the present invention can be further simplified in construction and can also be reduced in size, does not have a difficulty in the starting operation, and can facilitate the introduction of automation elements at the viewpoint of mass production, and has accordingly excellent advantages as compared with the conventional casting method.

When the molten silicon liquid is placed on the turntable as described above by flowing down the molten liquid obtained by melting the silicon base material in advance, it can satisfy the mass production, can facilitate the control of supplying the molten liquid, and can effectively obtain a uniform polycrystalline silicon wafer.

When the silicon base material is placed in advance on the turntable as means for disposing the molten silicon liquid and is heated and molten by the predetermined heat source, the crucible for melting the silicon becomes unnecessary, thereby reducing the facility cost, such an apparatus can be conveniently employed not only in an industrial production but in an empirical or trial production, and the time from melting to solidifying the silicon material can be shortened. Accordingly, it can also eliminate the problem of mixing an impurity with the wafer due to the atmospheric condition with good result.

In the apparatus exemplified in FIGS. 3 and 4, it has such difference from the apparatus shown in FIGS. 1 and 2 that the turntable 3' of the turntable mechanism 3 is not a merely planar plate, but is stood with a rising peripheral edge 8 on the wafer forming surface 3" at the outer peripheral side, the turntable 3' is telescopically elevationally movable in the heating space 2' with the melting heat source 2, and further a nozzle N is disposed directly above the center of the turntable mechanism 3.

As shown in FIGS. 3(a) and 3(b), the silicon base material B is placed at the center on the wafer forming surface 3" on the turntable 3', is heated and molten by the heat source 2, and the molten liquid thus obtained is radially outwardly flowed by means of the centrifugal force produced by the rotation of the mechanism 3 in such a manner that the mechanism 3 is gradually accelerated in rotation so that the molten liquid thus radially outwardly expanded reaches the rising peripheral edge 8. Thus, the thin molten liquid layer A of desired shape defined at the peripheral edge 8 can be formed, is then cooled and solidified to thus obtain a wafer product.

In the method thus exemplified, the molten liquid of the silicon material is radially outwardly flowed not only by the centrifugal force produced by the rotation of the turntable mechanism 3 but also by injecting gas 9 from the nozzle N to the molten liquid, thereby aiding to radially outwardly flowing the molten liquid.

The means for obtaining the molten liquid of silicon base material in the apparatus exemplified as above may be, as shown in FIGS. 1 and 2, the crucible for melting the silicon base material in advance, and the wafer forming surface 3" of the turntable of the turntable mechanism on which the molten silicon material is flowed down in the same manner as described above. In this case, it is preferred to heat the molten silicon material to the degree so as not to solidify the molten liquid by the heat source 2.

The means for injecting the gas 9 from the nozzle N to the molten liquid of the silicon base material may be, as shown in FIG. 4, constructed to inject the gas 9 in the configuration radially outwardly spreaded in a conical shape from the nozzle N steadily disposed to direct the gas downwardly, or may also be constructed, as shown in FIG. 5, not to steadily dispose the nozzle N but to tiltably dispose obliquely with respect to the axis the nozzle N and to tilt rockably as illustrated by broken lines with arrows, thereby radially outwardly inject the gas 9 sprayed from the nozzle N to the molten liquid obliquely with respect to the axis toward the outer peripheral edge side of the wafer forming surface 3".

Thus, the molten liquid of the silicon base material is rapidly flowed toward the rising peripheral edge 8, and the thin molten liquid layer A of predetermined size defined at the outer peripheral edge A' by the peripheral edge 8 with a uniform thickness. The gas 9 thus used may include preferably an inert gas, e.g., agron (Ar), helium (He), etc.

When the molten liquid layer A is thus obtained, it is then cooled and solidified in the same manner as described with respect to the previous embodiment of the apparatus of the invention. The cooling means may be constructed to lower the turntable mechanism 3 and to thus move the turntable 3' out of the heating space 2'. In this case, the turntable 3' may be lowered after the thin molten liquid layer A is obtained, or the molten liquid layer A may be formed while precedingly lowering the turntable 3'. Or, the molten liquid layer A may be cooled while the turntable 3' is steadily mounted by deenergizing the heat source 2. In order to complete the solidification of the molten liquid layer A in a short time, it is preferred to supply coolant 7, e.g., water, inert gas or the like as described with reference to FIG. 2 while lowering the turntable 3' as described above.

FIG. 6 shows in detail the flowing mechanism of the coolant 7. In FIG. 6, the coolant 7 is flowed upwardly through a feed pipe 10 inserted into a pipe of the rotating shaft 3''', is then passed through a forward passage formed by the partition wall formed in the turntable 3', is further passed via a folded port 12 of the rising peripheral wall 8 through a backward passage 13, and is thereafter exhausted through an annular passage 14 of the outer periphery of the rotating shaft 3''' from the opening end $3_1$.

According to the method of fabricating the polycrystalline silicon wafer with the gas injection means of this embodiment of the invention, the molten liquid of the silicon base material can be forcibly flowed at an extremely high speed by injecting the gas from the nozzle, and thus the productivity of the method can be remarkably improved, the opportunity of mixing an impurity with the molten liquid can be abruptly shortened, and the wafer of predetermined size can be simply obtained by the rising peripheral edge of the wafer forming surface at the outer peripheral side. When the wafer forming surface of the turntable is retained horizontally, the wafer of uniform thickness can be simply obtained from the thin molten liquid layer thus formed from the molten liquid of the silicon base material thus flowed to the rising peripheral edge of the wafer forming surface. In addition, when the molten liquid layer is solidified, it can eliminate, since the upper surface of the thin molten liquid layer is opened with the atmosphere, the difficulties of the conventional ingot slicing method and ribbon method, and yet can eliminate the restriction by the respective inner surfaces of the casting mold of the conventional casting method. Accordingly, since the molten liquid of the silicon base material can be solidified in the free state with respect to the longitudinally axial direction and there is no particular detrimental factor of growing the crystalline grains, large crystalline grains can be grown relatively uniformly, and the wafer of good conversion efficiency can be obtained.

Figure 9:
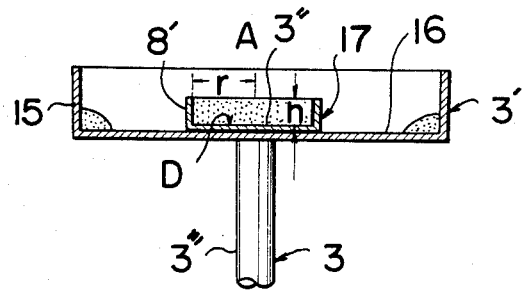
FIG. 9 is an explanatory front longitudinally sectional view of another modified example of the turntable mechanism used in the apparatus of the invention.
Figure 10:
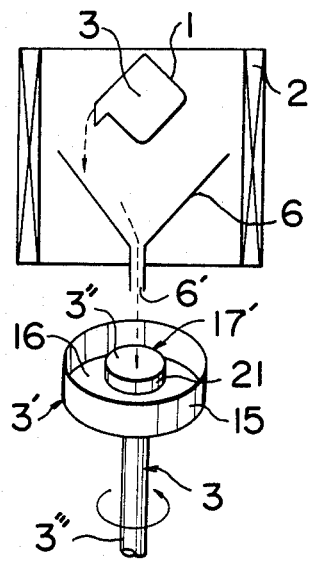
FIG. 10 is an explanatory front view of the apparatus for executing the method of the invention.

Still another preferred embodiment of the method of fabricating the polycrystalline silicon wafer executed by the apparatus exemplified in FIGS. 7 and 9 will be described. In this embodiment of the apparatus, the construction of the crucible 1, the melting heat source 2, the center 5 of rotation, the funnel 6 and the outlet 6' is constructed in the same manner as that shown and described with respect to FIG. 2, but it is different from the apparatus shown in FIG. 2 that the forming member of the wafer forming surface 3'' of the turntable mechanism 3 is not the turntable 3'.

More particularly, the turntable 3' is arranged under the heating condition of the melting heat source 2, and is further stood with a rising peripheral wall 15 at the outer peripheral side, which has a function for recovering the excessive silicon as a recovery tray 16 as will be described in greater detail. A wafer tray 17 is placed at the center on the turntable 3', is detachable adhered onto the turntable 3' as required, and is formed with the wafer forming surface 3'' thereon.

The wafer tray 17 is composed of a rising peripheral edge 8' and a bottom plate having a wafer forming surface 3''. The shape of the outer periphery of the peripheral edge 8' may be not only circular, but also polygonal, e.g., square as shown in FIG. 7, or other shape. The recovery tray 16 of the turntable 3' is so constructed that the rising peripheral wall 15 is higher than the rising peripheral edge 8' of the wafer tray 17.

In the method of this embodiment of the invention, the molten liquid of the silicon base material is dropped to the substantially center of the wafer tray 17 from the outlet 6' of the funnel 6 in the same manner as described with reference to FIG. 2, and the molten liquid is radially outwardly flowed by means of the centrifugal force produced by the rotation of the turntable 3' and hence the wafer tray 17 via the turntable mechanism 3 in the same manner as described previously.

Figure 8A:
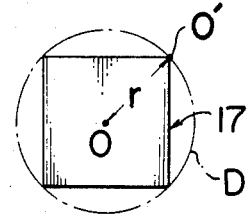
FIGS. 8(a) and 8(b) are explanatory plan views of the wafer tray of the apparatus in various modified forms.
Figure 8B:
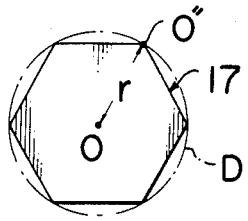

The quantity of supplied molten liquid to be dropped in the above embodiment of the method of the invention is determined as below. As shown in FIGS. 8(a) and 8(b), when the rising peripheral edge 8'' of the wafer tray 17 is formed square or hexagonal, the molten liquid of the quantity equal to or more of the volume of the cylindrical space having the length from the center O to the farthest inner positions O', O'' and hence the maximum inner diameter 2r and the depth h of the rising peripheral edge is supplied. Thus, the wafer tray 17 is filled with the molten liquid thus radially outwardly flowed, and the excessive molten liquid is exhausted or overflowed outwardly from the upper edge of the wafer tray 17. The molten liquid thus exhausted is dropped and solidified in the recovery tray 16 in the case of this embodiment, and accordingly it can eliminate the wasteful consumption of the silicon base material and the exhausted molten liquid of the silicon base material can be reused in this manner.

Since the thin molten liquid layer A can be formed of the molten liquid filled in the wafer tray 17 as described above, it can be solidified by natural cooling or by the forcibly cooling means of adequate means for the wafer tray 17, and the polycrystalline silicon wafer of the product can be thus obtained advantageously.

The experimental example of fabricating the polycrystalline silicon wafer will now be described. A wafer tray 17 made of quartz and formed in square of 5 mm thick with a rising peripheral edge 8' formed in a square of 50 mm of one side was employed. The recover tray 16 had 100 mm of inner diameter and 20 mm of depth made of quartz. Approx. 50 g of silicon base material was thrown into the crucible 1, was then heated at 1,450° C. therein, and the molten liquid of the silicon base material was then dropped through the funnel 6 to the center on the wafer tray 17 rotating at the predetermined constant speed. Thus, the wafer of the same shape as the interior of the wafer tray 17 could be thus obtained, and the silicon exhausted to the recovery tray 16 was then recovered.

According to the method of this embodiment of the invention, when the space defined by the wafer forming surface 3'' and the rising peripheral edge 8' is set at the desired dimensions using the wafer tray 17 and the like, the wafer of the desired profile, e.g., polygonal shape and the like can be readily obtained. It is preferred even in this case in the same manner as described with respect to the previous embodiment to contain the molten metal in the apparatus in a chamber (not shown) and to evacuate the chamber in vacuum or to fill inert gas atmosphere therein.

Still another preferred embodiment of the method of fabricating the polycrystalline silicon wafer according to this invention will be described with reference to FIGS. 10 through 13. The apparatus exemplified in FIG. 10 has the same members as those shown in FIG. 7, but is constructed differently from that shown in FIG. 7 that the wafer forming surface 3'' is not provided by the wafer tray 17 but is formed as the ceiling of the wafer tray 17'. The wafer tray 17' is placed at the center of axis of the turntable 3' in the same manner as shown in FIG. 7', and the recovery tray 16 is formed by the turntable 3'.

Figure 12:
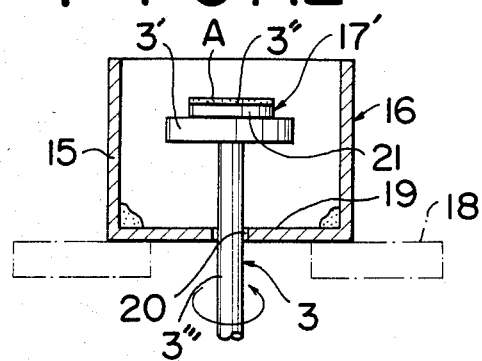
FIG. 12 is an explanatory front longitudinally sectional view of still another modified example of the turntable mechanism of the invention.
Figure 13:
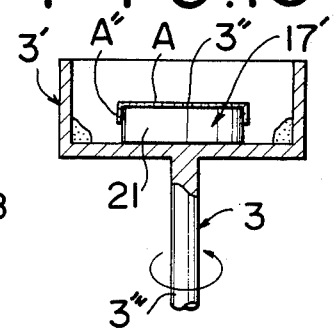
FIG. 13 is an explanatory front longitudinally sectional view of the turntable mechanism shown in FIG. 10 in case that defective wafer is fabricated.

In the apparatus exemplified in FIG. 12, the turntable 3' fixedly secured to the upper end of the rotating shaft 3''' is a merely planar plate, and the wafer tray 17' is placed at the center of the axis of the plate 3'. In this case, the recovery tray 16 is advantageously separated from the turntable 3' In the exemplified embodiment, an axial hole 20 is perforated at the bottom 19 of the recovery tray 16 provided at the desired fastening position 18, and the rotating shaft 3''' is movably passed therethrough.

The molten liquid of the silicon base material is thus dropped from the outlet 6' of the funnel 6 to the substantially center of the wafer forming surface 3'' of the ceiling of the wafer tray 17' in the same manner as was described with reference to FIG. 7 using the apparatus exemplified as above, and is radially outwardly flowed by means of the centrifugal force produced by the rotation of the turntable mechanism at the adequate time in the same manner as was described previously.

The wafer tray 17 may have the wafer forming surface 3'' of desired shape, e.g., circular, square, etc. of various dimensions, any of which can be arbitrarily selected. When the quantity of the molten liquid is sufficiently supplied, the molten liquid of the silicon base material thus radially outwardly flowed is spread over the entire surface of the wafer forming surface 3'', is thus extended to the outer peripheral edge, and the excessive molten liquid is discharged from the outer peripheral edge by the centrifugal force produced, with the result that the thin molten liquid layer A matched to the shape of the wafer forming surface 3'' is thus formed, and is solidified by natural cooling or by adequate cooling means, thereby producing the wafer of the desired product. In the apparatus thus exemplified, the molten silicon liquid thus scattered and discharged from the outer peripheral edge can be reused by cooling and solidifying it with the recovery tray 16 in the same manner as was described previously.

The experimental example of fabricating the polycrystalline silicon wafer will now be described. The wafer tray 17' made of graphite having a thickness of 5 mm was employed. The recovery tray 16 had 180 mm of inner diameter and 20 mm of depth made of quartz. The wafer tray 17' was heated at 800° to 1,300° C. in the apparatus exemplified in FIG. 11 under the control, the turntable mechanism 3 was rotated at 100 to 500 r.p.m., the silicon base material in the crucible 1 made of quartz was molten at 1,455° C., the molten liquid thus molten was then supplied onto the wafer forming surface 3', and wafers of various products having 50 mm. 50 mm, and 70 mm, 100 mm of diameter were obtained.

Figure 11:
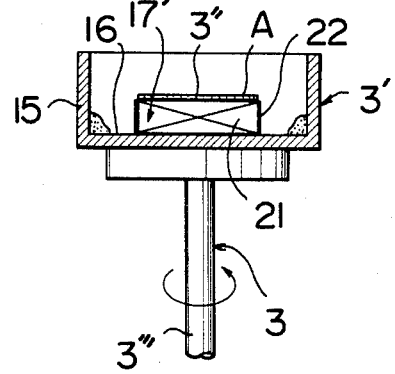
FIG. 11 is an explanatory front longitudinally sectional view of still another modified example of the turntable mechanism of the apparatus of the invention.

When the method thus exemplified was carried out, a moisture preventive agent 22, e.g., boron nitride or the like is coated in advance as shown in FIG. 11 on the outside surface 21 continuously depending perpendicularly from the wafer forming surface 3'' of the ceiling of the wafer tray 17'.

That is, when the method of fabricating the polycrystalline silicon wafer of the invention is carried out, in case that various conditions such as, the quantity of supplied molten silicon liquid, the thickness of the wafer of the product thus obtained, and other mechanical factors are improper, the molten liquid discharged from the wafer forming surface 3'' might not scatter to the recovery tray 16, but might be flowed down to the outside surface 21 of the wafer tray 17'. In this case, the wafer of the product thus obtained is formed not to be planar, but is formed with a dish shape having depending edge A'' solidified integrally with the planar part. This depending edge A'' should be cut off from the wafer of the product thus formed.

Since the step of coating the moisture preventive agent, e.g., boron nitride or the like on the outside surface 21 is added to the method exemplified as above according to the present invention, the molten liquid of the silicon base material thus crept to the outside surface 21 of the wafer tray 17' is repelled by the boron nitride thus coated and is not thus integrated with the molten liquid on the wafer forming surface 3'', and is all recovered as excessive molten silicon liquid by the recovery tray 16.

According to the method of the embodiments exemplified as above of the invention, the wafer of the product with various dimensions and shapes can be fabricated without strict controls for the rotating speed of the turntable mechanism 3, the temperature of the wafer forming surface 3'', the height of the funnel 1, etc. in this manner. When the apparatus thus exemplified with the recovery tray 16 for receiving the excessive molten liquid scattered from the wafer forming surface 3'' at the outer peripheral side of the wafer forming surface 3'' is employed as shown in FIGS. 11 and 12, it can eliminate the wasteful loss of the silicon base material and various defects caused by the scattered molten liquid of the silicon base material.

Figure 16:
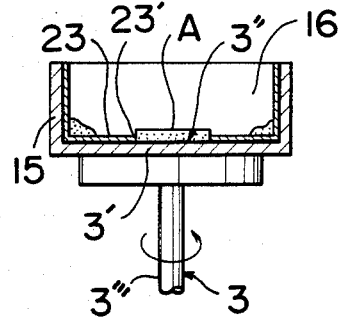
FIG. 16 is an explanatory front longitudinally sectional view of the further modified turntable mechanism of the invention.

Still another preferred embodiment of the method of fabricating the polycrystalline silicon wafer according to the invention will be further described with reference to the apparatus exemplified in FIGS. 14 and 16. In the apparatus thus exemplified, the turntable mechanism 3 as shown is employed, and the other members are constructed in the same manner as those shown in FIGS. 7 and 10.

Figure 14:
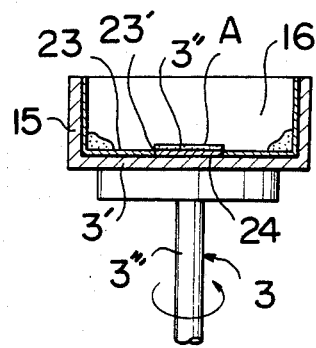
FIG. 14 is an explanatory front longitudinally sectional view of the turntable mechanism in the apparatus for executing the method of the invention.

In FIG. 14, a turntable 3' is fixedly secured onto the upper end of the rotating shaft 3''' in the turntable mechanism 3, the rising peripheral wall 15 is stood from the outer peripheral side of the turntable 3' in the same manner as shown in FIGS. 4 and 5, an excessive silicon discharging surface 23 is formed by coating boron nitride on the outer periphery on the upper surface of the turntable 3', and the wafer forming surface 3'' is so formed on the upper surface of the turntable 3' with the inside edge 23' of the discharging surface 23 as to be coaxial with the center of rotation of the turntable mechanism 3.

Figure 15:
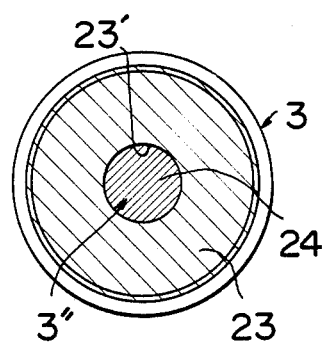
FIG. 15 is a plan view of the mechanism in FIG. 14.

The wafer forming surface 3' may be formed in shape by the inside edge 23' to become circular, square, or other desired profile depending upon the shape of the wafer to be obtained. In the embodiment exemplified in FIGS. 14 and 15, the wafer forming surface 3'' does not employ the upper surface of the turntable 3' as it is, but a mold releasing agent 24, e.g., silicon nitride or the like is coated on the upper surface of the turntable 3', and the surface of agent 24 is used as the wafer forming surface 3''. In this case, it is preferred to dispose the excessive silicon discharging surface 23 in the same height as the wafer forming surface 3'', but the wafer forming surface 3'' may be lower than the excessive cilicon discharging surface 23. Further, as exemplified in FIGS. 14 and 15, the boron nitride may be coated not only on the upper surface of the turntable 3' but also to the inside surface of the rising peripheral wall 15, and thus the outer periphery of the turntable 3' is used as the recovery tray 16.

When the wafer is fabricated with the apparatus thus exemplified according to the method exemplified as above of the invention, the supplied molten liquid of the silicon base material is supplied to the wafer forming surface 3" coated with the mold releasing agent 24, is then radially outwardly flowed over the entire surface of the wafer forming surface 3" by means of the centrifugal force produced by the rotation of the turntable mechanism 3, and when it is desired to further flow radially outwardly the molten liquid, the molten liquid is flowed into the excessive silicon discharging surface 23. Since the boron nitride is coated on the discharging surface 23 in this case, the discharging surface 23 does not have wettability with all substances and is stable even at high temperature. Accordingly, the molten liquid thus flowed thereto is scattered by the centrifugal force, is in turn solidified on the discharging surface 23. Thus, the silicon material thus scattered can be recovered and reused. In this manner, the thin molten liquid layer A can be formed over the entire surface of the wafer forming surface 3" with the supplied molten liquid of the silicon base material, is then cooled by natural cooling or by forcible cooling means, and is thus solidified, thereby obtaining the wafer of the product.

Figure 17:
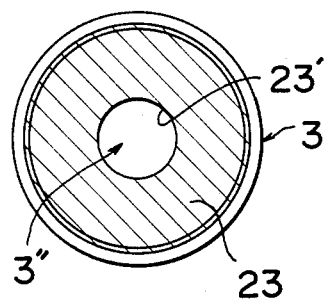
FIG. 17 is an explanatory plan view of the mechanism in FIG. 14.

Still another preferred embodiment of the method of fabricating the polycrystalline silicon wafer according to the invention will be described further with reference to FIGS. 16 and 17. In FIGS. 16 and 17, the supplied molten liquid of the silicon base material is supplied directly onto the upper surface of the turntable 3'. In this case, the molten liquid is radially outwardly flowed over the entire surface of the wafer forming surface 3". The molten liquid placed lower than the excessive silicon discharging surface 23 is prevented from being further flowed radially outwardly by the inside edge 23' as shown in FIG. 14, the molten liquid raised higher than the discharging surface 23 is scattered and discharged, though tending to further radially outwardly flow, via the discharging surface 23 coated with the boron nitride, and the thin molten liquid layer A defined by the inside edge 23' of the discharging surface 23 is eventually formed, is then cooled and solidified, thereby obtaining the wafer of the product.

Experimental example of fabricating the polycrystalline silicon wafer according to the method thus exemplified will be described. The turntable 3' was formed of a quartz tray having 180 mm of inner diameter and 20 mm of depth, the wafer forming surface 3" was so formed on the central part as to match the coating center of the silicon nitride, boron nitride was coated by spraying or in paste state on the remaining surface, or the silicon nitride was not coated, but the turntable mechanism was rotated at 100 to 500 r.p.m., was heated under control at 800 ° to 1,300° C., the molten liquid of the silicon base material was supplied thereto, and a aquare wafer having 50 mm. 50 mm or 100 mm of diameter in the same shape as the wafer forming surface 3" was fabricated.

When the wafer is fabricated with the method thus exemplified as above, it can eliminate the wafer trays 17 and 17' employed in the previous embodiments. Accordingly, it can also eliminate the fault of the trays 17, 17' causing a variation unintentionally during the rotation. Since the wafer forming surface of any shape can be simply formed by coating the boron nitride thereon, the wafer of any arbitrary shape, e.g., circular, polygonal, etc. can be simply fabricated, and the excessive wafer can be simply recovered with the scattered silicon base material.

Figure 18A:
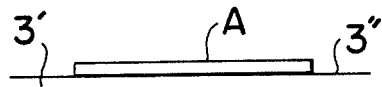
FIGS. 18(a) through 18(d) are explanatory views of the steps of fabricating the wafer according to the present invention.
Figure 18B:
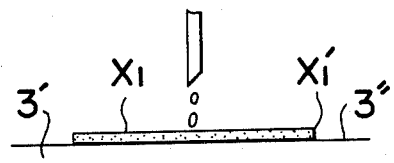

The method of fabricating the polycrystalline silicon wafer as exemplified with the aforementioned various embodiments can be carried out with the apparatus exemplified in FIGS. 1 and 2. When the thin molten liquid layer A is obtained on the wafer forming surface 3" of the turntable 3' as shown in FIG. 18(a) in accordance with the method thus exemplified with the apparatus shown in FIGS. 1 and 2, a substrate wafer $X_1$ shown in FIG. 18(b) by cooling and solidifying the layer. Since the thickness of the substrate wafer $X_1$ is, in this case, not controlled by the quantity of the supplied molten liquid, but determined according to various factors, e.g., the temperature of the wafer forming surface 3", the rotating speed of the turntable mechanism 3, and the distance between the wafer forming surface 3" and the outlet 6' of the funnel 6, etc., the substrate wafer $X_1$ is formed under the prescribed conditions of these parameters.

Further, the molten silicon liquid of the prescribed quantity is dropped and supplied on the substrate wafer $X_1$ thus obtained at the center under the conditions not so different from the prescribed conditions, and is thus radially outwardly flowed by the centrifugal force produced by the rotation of the turntable mechanism 3 on the upper surface of the substrate wafer $X_1$.

The molten liquid of the silicon base material thus supplied melts the upper surface layer of the substrate wafer $X_1$ and causes the lower surface layer of the wafer $X_1$ to be not molten in the course of radially outwardly flowing thereon. In this case, the molten liquid flows into the pinholes occurred on the substrate wafer $X_1$, thus fills the pinholes, and buries the recesses, if any. Further, the molten liquid radially outwardly flows while melting the upper surface layer of the wafer $X_1$, and accordingly causes an adhesive force between the molten liquid and the upper surface layer. Thus, the molten liquid radially outwardly flows without flowing outwardly from the outer peripheral edge $X_1'$ of the wafer $X_1$ unless the forming conditions of the substrate wafer $X_1$ are not so extremely different from those of this molten liquid.

Figure 18C:
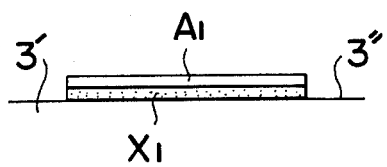
Figure 18D:
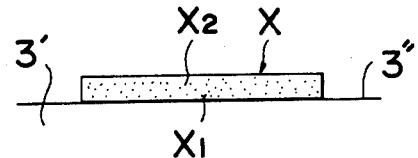

Thus, the molten liquid is spread over the entire surface of the substrate wafer $X_1$, the increased thick molten liquid layer A is formed as shown in FIG. 18(c), is then cooled and solidified, the increased thick wafer $X_2$ fusibly bonded and solidified to the substrate wafer $X_1$ can be thus obtained, and the wafer of the product X formed by integrating the substrate wafer $X_1$ with the increased thick wafer $X_2$ can be obtained as shown in FIG. 18(d).

According to the present invention, the molten liquid of the silicon base material is thus supplied in the same manner as described above onto the upper surface of the increased thick wafer $X_2$ thus formed as described above, the increased thick wafer part (not shown) may be laminated repeatedly in the prescribed required number of times, and may be laminated at least once with the step of forming the increased thick wafer part as described above.

Experimental example of fabricating the polycrystalline silicon wafer according to the method exemplified as above of the invention will be described. A turntable 3' made of quartz having 80 mm of inner diameter and 4 mm of depth was employed. The turntable was maintained at high temperature constantly, was then turned by rotating the turntable mechanism 3 at 50 5000 r.p.m., approx. 50 g of silicon base material B was thrown into the crucible 1 made of quartz, was heated at 1,450° C., was thus molten, and the molten liquid was then flowed down to the center of the turntable 3' through the funnel 6 of quartz as described above first in the quantity of approx. 25 g., the thin molten liquid layer A was then solidified after several seconds to several minutes, and the substrate wafer $X_1$ was thus obtained. The thickness of the wafer $X_1$ was approx. 0.2 mm.

Then, the molten liquid of the remaining 25 g was supplied to the center on the upper surface of the substrate wafer $X_1$ in the same manner as above, the increased thick wafer part $X_2$ was thus formed thereon, and the thickness of the wafer X was 0.4 to 0.5 mm.

It is appreciated from the foregoing description that since the method of fabricating the polycrystalline silicon wafer exemplified according to the present invention does not obtain the wafer by only one supply of the molten liquid of the silicon base material, but obtains the wafer by supplying more than twice the molten liquid as described above, the pinholes and recesses existing on the increased thick wafer part $X_2$ can be corrected when the substrate wafer $X_1$ is formed by supplying the molten liquid of the silicon base material more than three times onto the substrate wafer $X_1$, with the result that no pinhole nor recess exists on the final wafer thus formed, or extremely small number of the pinholes and recesses exist on the wafer thus formed. Thus, the polycrystalline silicon wafer adapted for the semiconductor wafer to be used for producing a solar battery or the like can be fabricated.

What is claimed is:

1. In an apparatus for fabricating a polycrystaline silicon wafer, said apparatus having:

(a) a centrifugal zone having a defined outer rising peripheral edge (15) which encloses said zone;
   (b) a dispensing zone located over the centrifugal zone adapted for pouring a predetermined measured quantity of molten silicon at about the center of said centrifugal zone; and,
   (c) means for cooling a silicon layer which is poured over the surface of said centrifugal zone;, the improvement in said apparatus, comprising, in combination:
   (d) a turntable (3') disposed in said centrifugal zone under said dispensing zone, said outer rising peripheral edge (15) being a wall around said centrifugal zone; and,
   (e) a wafer tray (17) disposed on said turntable (3') said wafer tray (17) having a second peripheral edge (8'), the zone wall being higher than said second peripheral edge (8'), said wafer tray (17) being somewhat smaller in size than the centrifugal zone, and having a bottom plate with a wafer-forming surface (3''), the space between the tray second peripheral edge (8') and said wall defining a recovery zone (16), so that said molten silicon liquid from said dispensing zone is poured substantially onto the center of said wafer tray (17), and, the molten silicon liquid flows radially outwards by the centrifugal force created by the rotation of the turntable (3') which also rotates the wafer tray (17), excess molten liquid overflowing the second peripheral edge (8') and falls and solidifies in the recovery zone (16) so that the silicon base material can be recovered and reused.

2. An apparatus as claimed in claim 1 wherein said wafer tray (17) is of rectangular shape, and said centrifugal zone is of circular shape.

* * * * *